US010795825B2

(12) United States Patent
Tomei et al.

(10) Patent No.: US 10,795,825 B2
(45) Date of Patent: Oct. 6, 2020

(54) COMPRESSING DATA FOR STORAGE IN CACHE MEMORIES IN A HIERARCHY OF CACHE MEMORIES

(71) Applicant: Advanced Micro Devices, Inc., Santa Clara, CA (US)

(72) Inventors: Matthew J. Tomei, Urbana-Champaign, IL (US); Philip B. Bedoukian, Ithaca, NY (US); Shomit N. Das, Austin, TX (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 0 days.

(21) Appl. No.: 16/232,314

(22) Filed: Dec. 26, 2018

(65) Prior Publication Data

US 2020/0210343 A1 Jul. 2, 2020

(51) Int. Cl.
*G06F 12/00* (2006.01)
*G06F 12/0897* (2016.01)
*G06F 12/0815* (2016.01)

(52) U.S. Cl.
CPC ...... *G06F 12/0897* (2013.01); *G06F 12/0815* (2013.01); *G06F 2212/283* (2013.01); *G06F 2212/401* (2013.01)

(58) Field of Classification Search
CPC ............. G06F 12/0897; G06F 12/0815; G06F 2212/283; G06F 2212/401
See application file for complete search history.

(56) References Cited

U.S. PATENT DOCUMENTS

| | | | | |
|---|---|---|---|---|
| 2008/0055323 | A1* | 3/2008 | Franaszek | ........... G06F 12/0897 345/530 |
| 2013/0311722 | A1* | 11/2013 | Arelakis | ................. H03M 7/40 711/122 |
| 2017/0286220 | A1* | 10/2017 | Gerhard | .................. G06F 3/065 |

OTHER PUBLICATIONS

S. Mittal and J. Vetter, A Survey of Architectural Approaches for Data Compression in Cache and Main Memory Systems, IEEE Transactions on Parallel and Distributed Systems, 2016, vol. 27, pp. 1524-1536.
A Arelakis et al., HyComp: A Hybrid Cache Compression Method for Selection for Data-Type-Specific Compression Methods, Proceedings of the 48th International Symposium on Microarchitecture, Dec. 2015, pp. 38-49.

* cited by examiner

*Primary Examiner* — Shawn X Gu
(74) *Attorney, Agent, or Firm* — Park, Vaughan, Fleming & Dowler LLP

(57) ABSTRACT

An electronic device includes at least one compression-decompression functional block and a hierarchy of cache memories with a first cache memory and a second cache memory. The at least one compression-decompression functional block receives data in an uncompressed state, compresses the data using one of a first compression or a second compression, and, after compressing the data, provides the data to the first cache memory for storage therein. When the data is retrieved from the first cache memory to be stored in the second cache memory, when the data is compressed using the first compression, the compression-decompression functional block decompresses the data to reverse effects of the first compression on the data, thereby restoring the data to the uncompressed state and provides the data compressed using the second compression or in the uncompressed state to the second cache memory for storage therein.

20 Claims, 5 Drawing Sheets

COMPRESSING DATA FOR STORAGE IN CACHE MEMORIES IN A HIERARCHY OF CACHE MEMORIES

GOVERNMENT RIGHTS

This invention was made with government support under the PathForward Project with Lawrence Livermore National Security (prime contract no. DE-AC52-07NA27344, subcontract no. B620717) awarded by the DOE. The government has certain rights in this invention.

BACKGROUND

Related Art

Some electronic devices include processors that execute program code for performing various operations. For example, the electronic devices may include one or more central processing unit cores (CPU cores) or graphics processing unit cores (GPU cores) that execute program code for software applications, operating systems, etc. Many of these electronic devices, along with a memory (e.g., a "main" memory) and a mass-storage device, include one or more cache memories for storing program code and/or data. Cache memories are fast-access memories that are used for locally storing copies of program code and/or data to enable rapid retrieval by processors for use when executing program code or performing other operations. Accessing copies of program code and/or data in cache memories is typically at least an order of magnitude faster than accessing the program code and/or data in the memory and the mass-storage device.

Cache memories ordinarily have only limited capacity for storing copies of program code and/or data—and normally have significantly less capacity than a memory or a mass-storage device. For example, some electronic devices include a hierarchy of cache memories in which a highest or first level of cache memory (i.e., an "L1" cache) has 32-64 kilobytes (kB) of capacity, a middle or second level of cache memory (i.e., an "L2" cache) has 512-1024 kB of capacity, and a lowest or third level of cache memory (i.e., an "L3" cache) has 2-4 megabytes (MB) of capacity. In such an electronic device, the memory might have 32-64 gigabytes (GB) of capacity and the mass-storage device might have 4-8 terabytes (TB) of capacity. Because cache memories have limited storage capacities, during operation, processors regularly request the storage of sufficient copies of program code and/or data to exceed the capacity of the cache memories for simultaneously storing the copies. Cache memories may therefore be forced to evict or otherwise discard existing stored copies of program code and/or data to free up space for storing incoming copies of program code and/or data. For example, cache memories may write back modified copies of data to memory or a lower level cache memory and/or invalidate unmodified copies of data to make room for incoming copies of data.

In an effort to better use the available storage capacities of cache memories, designers have proposed numerous techniques for improving the arrangement of program code and/or data stored in the cache memories. For example, some designers have proposed compressing program code and/or data so that the program code and/or data can be stored in less space in the cache memories. For this technique, before storing program code and/or data in a cache memory, the program code and/or data is compressed to reduce the data in size. When the compressed program code and/or data is subsequently provided from the cache memory to a requesting processor, the program code and/or data is decompressed to restore the program code and/or data to the uncompressed state.

Although compression results in reduced size for program code and/or data stored in cache memories, compression is not always an ideal solution. This is due to the characteristics of the different types of compression that might be used for compressing program code and/or data for storage in cache memories. For example, using heavier-weight compressions (i.e., compressions having relatively more, slower, and/or more complex compression operations) can result in the compression of a larger proportion of program code and/or data, but can take a longer time for compression and decompression. Heavier-weight compressions are therefore less desirable for higher-level cache memories in which response latency is an important consideration. As another example, lighter-weight compressions may quickly compress program code and/or data using relatively simple compression operations, but are only able to compress program code and/or data that include a limited set of patterns or values. While providing at least a small amount of reduction in the size of program code and/or data without incurring larger compression latencies, lighter-weight compressions may not be able to compress enough data to free up significant space in larger cache memories. Given different performance requirements associated with different cache memories in a hierarchy of cache memories, designers have been unable to find a single compression that works for compressing program code and/or data for all of the cache memories.

BRIEF DESCRIPTION OF THE FIGURES

Throughout the figures and the description, like reference numerals refer to the same figure elements.

DETAILED DESCRIPTION

Figure 1:
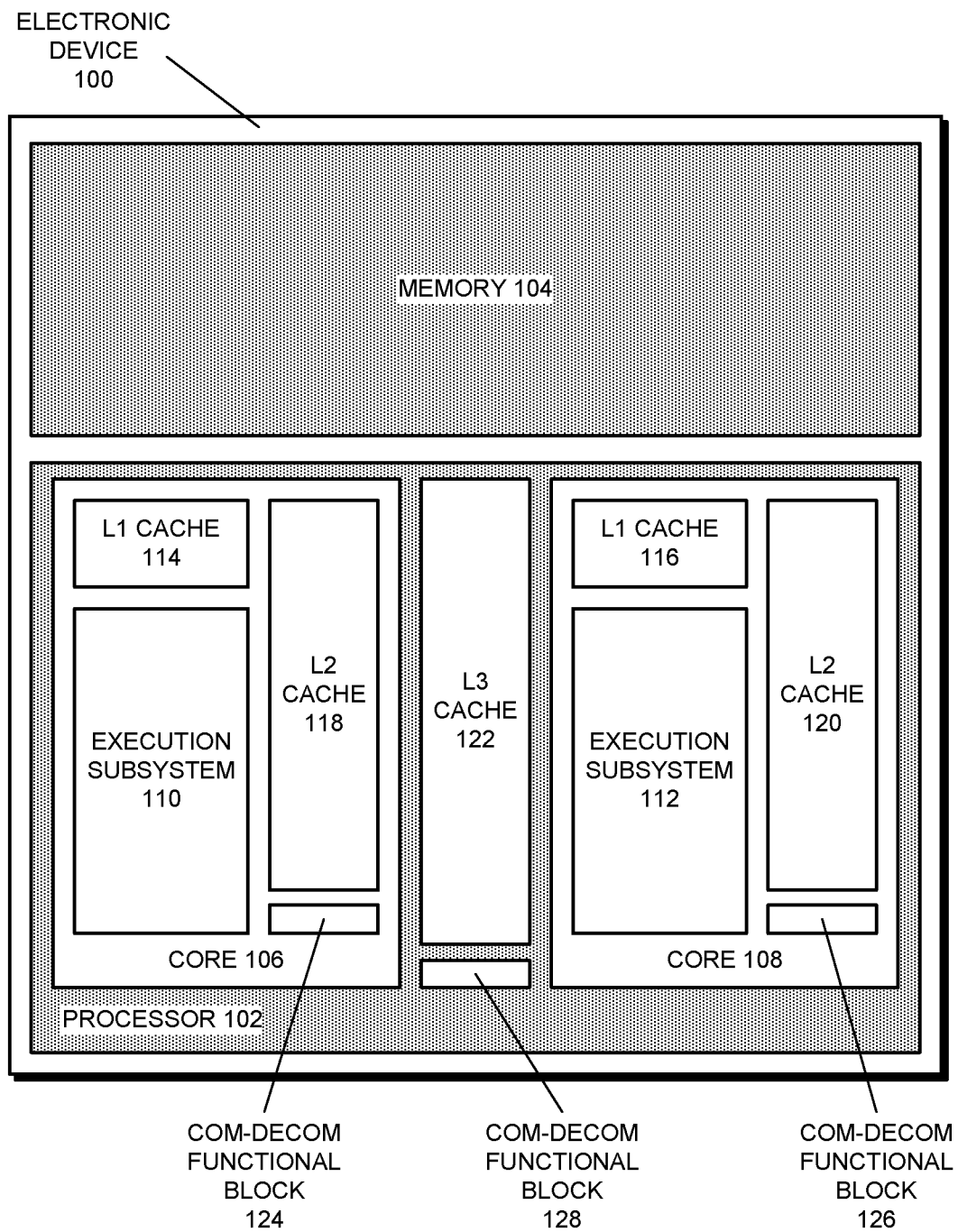
FIG. 1 presents a block diagram illustrating an electronic device in accordance with some embodiments.

The following description is presented to enable any person skilled in the art to make and use the described embodiments, and is provided in the context of a particular application and its requirements. Various modifications to the described embodiments will be readily apparent to those skilled in the art, and the general principles defined herein may be applied to other embodiments and applications. Thus, the described embodiments are not limited to the embodiments shown, but are to be accorded the widest scope consistent with the principles and features disclosed herein.

Terminology

In the following description, various terms are used for describing embodiments. The following is a simplified and general description of a few of these terms. Note that the terms may have significant additional aspects that are not recited herein for clarity and brevity and thus the description is not intended to limit the terms.

Functional block: functional block refers to a group, collection, and/or set of one or more interrelated circuit elements such as integrated circuit elements, discrete circuit elements, etc. The circuit elements are "interrelated" in that circuit elements share at least one property. For instance, the interrelated circuit elements may be included in, fabricated on, or otherwise coupled to a particular integrated circuit chip or portion thereof, may be involved in the performance of given functions (computational or processing functions, memory functions, etc.), may be controlled by a common control element, etc. A functional block can include any number of circuit elements, from a single circuit element (e.g., a single integrated circuit logic gate) to millions or billions of circuit elements (e.g., an integrated circuit memory).

Data: data refers to information or a value that can be stored in a cache memory or a memory (e.g., a main memory). For example, data can be or include information or a value that is to be used for or that is produced by an operation such as a computational operation, a control operation, a sensing or monitoring operation, a memory access operation, an input-output device communication, etc. As another example, data can be or include program code instructions or values from program code (e.g., variable values, constants, etc.) acquired from or destined for a computer-readable storage medium, a mass-storage device, a network interface, a memory, etc. As another example, data can be or include information acquired from or destined for functional blocks such as input-output devices, sensors, human interface devices, etc.

Overview

In the described embodiments, an electronic device includes a hierarchy of cache memories having a first cache memory and a second cache memory. The first cache memory is lower in the hierarchy than the second cache memory and therefore, in comparison to the second cache memory, may be slower to access, higher capacity, and/or located further from execution circuits that access data in the hierarchy of cache memories. For example, in some embodiments, the first cache memory is a level three ("L3") cache memory and the second cache memory is a level two ("L2") cache memory. In the described embodiments, data is compressed for storage in the cache memories in order to reduce the data in size and therefore more efficiently use the available capacities of the cache memories (recall that "data" is, as described above, a generic term describing any value or information that can be stored in a cache memory). Because the cache memories and data-accessing entities (e.g., CPU cores, GPU cores, etc.) have different tolerances for delays associated with compressing and decompressing data, the described embodiments use a combination of compressions for data to be stored in the cache memories. The particular compression(s) that are used for compressing data for each cache memory are selected to provide the benefit of reducing the data in size for that cache memory while also avoiding decompression operations that would undesirably delay responses to data access requests.

The second cache memory, which is higher in the hierarchy, is expected to respond to access requests in a smaller number of controlling clock cycles (e.g., 12-15 clock cycles). Adding more than a few clock cycles of delay to the response times of the second cache memory is therefore undesirable. For this reason, in some embodiments, the data in the second cache memory is compressed using a lighter-weight compression that involves few, simple, and/or fast compression operations. Because only the lighter-weight compression is used for data in the second cache memory in these embodiments, compressed data can be acquired from the second cache memory, decompressed, and returned to an accessing entity in a relatively short time. The first cache memory, which is lower in the hierarchy, is expected to respond to access requests promptly, but accesses to the first cache memory take numerous controlling clock cycles (e.g., 30-40 clock cycles). Adding several clock cycles of delay to the response times of the first cache memory therefore has a proportionally small impact—and accessing entities may tolerate the additional decompression-related latency. For this reason, in some embodiments, data in the first cache memory is compressed using a heavier-weight compression that, in comparison to the lighter-weight compression, involves more, more complex, and/or slower compression operations. When heavier-weight compression is used for data in the second cache memory, more patterns and/or values in the data may be compressed than when using the lighter-weight compression, but compressing and decompressing the data take relatively longer times.

In some embodiments, although data in the first cache memory is allowed to be compressed using the heavier-weight compression, data in the first cache memory is compressed using either of a lighter-weight compression or the heavier-weight compression. In these embodiments, data is preferentially compressed using the lighter-weight compression for storage in the first cache memory and is compressed using the heavier-weight compression when the data cannot be compressed using the lighter-weight compression. In other words, when an attempt to compress data using the lighter-weight compression is unsuccessful (e.g., due to the data missing patterns or values that may be compressed using the lighter-weight compression), these embodiments attempt to compress the data using the heavier-weight compression. These embodiments preferentially use the lighter-weight compression because data that has been compressed using the lighter-weight compression can be copied from the first cache memory to the second cache memory as-is and without intermediate decompression—and hence more quickly. In addition, although using the heavier-weight compression means that the data must be decompressed before being stored in the second cache memory, the heavier-weight compression can result in beneficial size reductions for storing data in the first cache memory that was unable to be compressed using the lighter-weight compression.

In some embodiments, data in the first cache memory is compressed using a sequence of—and thus combination of—both the lighter-weight compression and the heavier-weight compression. In these embodiments, data is initially compressed using the lighter-weight compression and the resulting compressed data is then again compressed using the heavier-weight compression. Entirely decompressing the data that is output from the sequence of compressions is performed using a reverse sequence of heavier-weight decompression and then lighter-weight decompression. In these embodiments, before being copied from the first cache memory to the second cache memory, data is decompressed to reverse effects of the heavier-weight compression, leaving the data compressed with the lighter-weight compression for storage in the second cache memory. This is done in order to take advantage of the beneficial size reductions of the heavier-weight compression for data in the first cache memory, albeit at the cost of decompressing the data to prepare the data for storage in the second cache memory. Note, however, that when data is copied from the first cache memory to the second cache memory, the data need only be decompressed to reverse the effect of the heavier-weight compression—the resulting decompressed data retains the effects of the lighter-weight compression. This makes the operation of copying the data from the first cache memory to the second cache memory faster than if the lighter-weight compression were also to be performed when storing the copy in the second cache memory.

By using the lighter-weight compression and heavier-weight compression for compressing data for the first cache memory and the second cache memory as described herein, the described embodiments reduce the size of data for storage in cache memories. In addition, by using the specified compressions for each cache memory, the latency of compressing and decompressing the data is arranged among the cache memories in such a way that accessing entities are less exposed to unacceptable delay in responses to access requests. The described embodiments are therefore able to store more data in the cache memories, but without introducing unacceptable delay to responses to data access requests. Storing more data in the cache memories means that accessing entities are able to access more data in the cache memories, helping to avoid the need for—and delay of—accessing data in the memory or mass-storage device. Accessing more data in the cache memories can therefore improve the performance of the accessing entities, and thus the overall performance of the electronic device, resulting in improved user satisfaction.

Electronic Device

FIG. 1 presents a block diagram illustrating electronic device 100 in accordance with some embodiments. As can be seen in FIG. 1, electronic device 100 includes processor 102 and memory 104. Generally, processor 102 and memory 104 are implemented in hardware, i.e., using various circuit elements and devices. For example, processor 102 and memory 104 can be entirely fabricated on one or more semiconductor chips, including on one or more separate semiconductor chips, can be fashioned from semiconductor chips in combination with discrete circuit elements, can be fabricated from discrete circuit elements alone, etc. As described herein, processor 102 and memory 104 perform operations associated with compressing data for storage in cache memories.

Processor 102 is a functional block that performs computational and other operations in electronic device 100 (e.g., control operations, configuration operations, etc.). For example, processor 102 can be or include one or more microprocessors, central processing units (CPUs), graphical processing units (GPUs), accelerated processing units (APUs), and/or other processing functional blocks. As can be seen in FIG. 1, processor 102 includes cores 106-108, each of which is a functional block such as a microprocessor core, a graphics processor core, an application specific integrated circuit (ASIC), etc. that performs computational and other operations. Within cores 106-108, execution subsystems 110-112 include functional blocks and circuit elements such as instruction fetch/decode units, instruction scheduling units, arithmetic logic units (ALUs), floating point operation units, compute units, programmable gate arrays, etc. for executing program code instructions and performing other operations.

Processor 102 includes a hierarchy of cache memories with, starting from a lowest level and proceeding to a highest level of the hierarchy, level one cache memories (L1 CACHE) 114-116 and level two cache memories (L2 CACHE) 118-120 in respective cores 106-108, and a level three cache memory (L3 CACHE) 122 that is shared by the cores. Each of the cache memories is a functional block that includes volatile memory circuits such as static random access memory (SRAM) circuits for storing copies of data, as well as control circuits for handling operations such as accesses of the data. At each level of the hierarchy, the respective cache memory/ies can be characterized at least in part by a capacity for storing copies of data, with smaller cache memories higher in the hierarchy, and a response time for responding to access requests, with shorter response times for cache memories higher in the hierarchy. For example, in some embodiments, L1 caches 114-116 have capacities of 32 kB and response times of 4-8 cycles (of a controlling clock), L2 caches 118-120 have capacities of 512 kB and response times of 12-15 cycles, and L3 cache 122 has a capacity of 4 MB and a response time of 35-40 cycles. At the first level, therefore, and assuming 64 B cache lines, L1 caches 114-116 can each simultaneously store up to 512 cache lines and are expected to respond to data access requests in 4-8 cycles of the controlling clock.

In the described embodiments, data is compressed before the data is stored in at least some of the cache memories in order to reduce the size of the data—thereby increasing the amount of data (e.g., number of cache lines) that can simultaneously be stored in the cache memories. For example, 64 B cache lines may be compressed to 48 B, 32 B, or another value, depending on the compression that is used for a given cache memory. In these embodiments, the cache memories include control mechanisms, look-up mechanisms, etc. that are operable with both compressed data and uncompressed data and combinations thereof. For example, these mechanisms may store differently-sized data within the cache memory (e.g., 64 B uncompressed cache lines and 32 B compressed cache lines, etc.), perform look-ups for both compressed and uncompressed data, acquire both compressed and uncompressed data from within the cache memory to be provided to accessing entities, etc. Generally, in the described embodiments, the cache memories are operable with both compressed and uncompressed data and combinations thereof.

In some embodiments, different compressions are used for the cache memories in each level of the hierarchy of cache memories (or for each individual cache memory). In these embodiments, the particular compression—or the heaviest-weight compression—that is allowed to be used for each cache memory is selected for cache memories at each level of the hierarchy (or for each cache memory) based at least in part on the desired response time to access requests for those cache memories. Generally, a response time for a cache memory that is lower in the hierarchy and thus has a longer response time is proportionally less effected by adding the latency of decompressing a heavier-weight compression. For example, adding eight clock cycles for data decompression to a given cache memory's 40-clock-cycle response time adds 20% to the response time, but the impact on shorter response times is more pronounced. Heavier-weight compressions are therefore allowed to be used for cache memories lower in the hierarchy. For example, in some embodiments, data in L1 caches 114-116, which are highest in the hierarchy and have the lowest response times, is not compressed, i.e., data is stored in uncompressed form in these cache memories. In these embodiments, data in L2 caches 118-120, which have intermediate response times, is permitted to be compressed using only a lighter-weight compression that adds a smaller amount of decompression latency to the response times. In these embodiments, data in L3 cache 122, which has the highest response time, is allowed to be (although may not be, as described herein) compressed using a heavier-weight compression that adds a larger amount of decompression latency to the response times.

In some embodiments, the compression and/or decompression of data is performed locally for cache memories in the hierarchy of cache memories. In these embodiments, some or all of the cache memories are associated with, and may be located near, a compression-decompression functional block. For example, a compression-decompression functional block may be incorporated into or otherwise associated with an interface for a data signal route or bus upon which data is received by a cache memory and via which data is provided to other cache memories. In these embodiments, compression-decompression functional blocks include circuit elements for performing compression and decompression operations for the compression(s) that are used for data in the corresponding cache memory. In the embodiment shown in FIG. 1, the compression-decompression functional blocks include compression-decompression (COM-DECOM) functional blocks 124-126 associated with L2 caches 118-120, respectively, and compression-decompression functional block 128 associated with L3 cache 122. In these embodiments, as data is received by or provided by a corresponding cache memory, a compression-decompression functional block performs operations for, if necessary, compressing the received data for storage in the cache memory or decompressing the data from the cache memory that is to be provided to another cache memory (or other accessing entity). Continuing the example above, when uncompressed data is received from L1 cache 114 by L2 cache 118 for storage therein (such as when data from execution subsystem 110 is propagating through the hierarchy of cache memories), compression-decompression functional block 124 compresses the data using the lighter-weight compression and then provides the compressed data for storage in L2 cache 118. In addition, and continuing the example, when compressed data is requested from L2 cache 118 by L1 cache 114, compression-decompression functional block 124 receives the compressed data from L2 cache 118, decompresses the data from the lighter-weight compression to the uncompressed state, and then provides the uncompressed data to L1 cache 114.

Memory 104 is functional block that performs operations of a memory (e.g., a "main" memory) for electronic device 100. Memory 104 includes volatile memory circuits such as fourth-generation double data rate synchronous DRAM (DDR4 SDRAM) and/or other types of memory circuits for storing data and instructions for use by functional blocks in electronic device 100 and control circuits for handling accesses of the data and instructions that are stored in the memory circuits and for performing other control or configuration operations.

In some embodiments, along with being compressed for storage in cache memories in the hierarchy of cache memories, data is compressed for storage in memory 104. In some embodiments, data is communicated among one or more functional blocks in a compressed state—and may be compressed for the communication. In some embodiments, data is left in the compressed state for communication and is decompressed at a destination cache memory or accessing entity. For example, compressed data retrieved from L2 cache 118 may not be immediately decompressed to remove the effects of the above-described lighter-weight compression (i.e., in compression-decompression functional block 124), but instead may be communicated to L1 cache 114 before decompression. In these embodiments, the arrangement of compression-decompression functional blocks may be different, with local compression and/or decompression mechanisms in one or more other locations (e.g., L1 cache 114, etc.) in electronic device 100. For example, data destined for L2 cache 118 from L1 cache 114 may be compressed at L1 cache 114 before being communicated to L2 cache 118—and may therefore arrive at L2 cache 118 in the compressed state (with the lighter-weight compression already applied).

Although a particular arrangement of cache memories is shown in FIG. 1, in some embodiments, a different number and/or arrangement of cache memories are present. For example, in some embodiments, L1 caches 114-116 are each divided into two separate cache memories in each of cores 106-108, one cache memory for storing program code instructions and one cache memory for storing data. Generally, the described embodiments are operable with any arrangement of cache memories for which the data compression operations herein described can be performed. In addition, although a number of compression-decompression functional blocks are shown in FIG. 1, in some embodiments, a different arrangement of functional blocks is used for performing the compression and decompression of data as described herein. For example, a cache controller in some or all of the cache memories may be modified to incorporate circuit elements for performing compression and/or decompression.

Electronic device 100 is simplified for illustrative purposes. In some embodiments, however, electronic device 100 includes additional or different functional blocks and elements. For example, electronic device 100 may include display subsystems, power subsystems, input-output (I/O) subsystems, etc. Electronic device 100 generally includes sufficient functional blocks and elements to perform the operations herein described.

Electronic device 100 can be, or can be included in, any device that performs computational operations. For example, electronic device 100 can be, or can be included in, a desktop computer, a laptop computer, a wearable computing device, a tablet computer, a piece of virtual or augmented reality equipment, a smart phone, an artificial intelligence (AI) or machine learning device, a server, a network appliance, a toy, a piece of audio-visual equipment, a home appliance, a vehicle, etc., and/or combinations thereof.

Data Compression

In the described embodiments, data is compressed for storage in cache memories in a hierarchy of cache memories and decompressed as needed for storing the data in cache memories or using the data (recall that "data" as used herein refers to any information or value that can be stored in a cache or memory). Generally, "compressing" data involves operations for losslessly reducing a size, e.g., a number of bits or bytes, of the data for storage of the data, communication of the data via various communication mechanisms, and other operations. Because the data is losslessly compressed, compressed data can be "decompressed" in order to restore the full uncompressed value of the data.

There are numerous types of data compression and various implementations of each type of compression that are known in the art. For example, pattern matching compression, value matching compression, zero content compression, Lempel-Ziv (LZ) (and variants) compression, Markov compression, and delta compression are a few of the many types of compression—and different implementations have been proposed for some or all of the types of compression. The described embodiments are not limited to any particular types of compression, but instead are operable with any combination of compressions that can be performed for data to be stored in cache memories.

As described herein, in some embodiments, a combination of "lighter-weight" compression and "heavier-weight" compression is used. Generally, lighter-weight compression is or includes one or more types of compression that are faster (and possibly significantly faster) to compress and/or decompress than one or more types of compression of or included in the heavier-weight compression. For example, in some embodiments, the lighter-weight compression may be or include types of compression that can be compressed and/or decompressed in 1-3 cycles (of a controlling clock), whereas the heavier-weight compression may be or include types of compression that can be compressed and/or decompressed in 6-10 cycles. The difference in the lighter-weight compression and the heavier-weight compression can be due to differences in one or more of the number of compression operations performed, the complexity of the compression operations, and/or the speed at which the compression operations are performed.

In some embodiments, although an attempt is made to compress data, patterns, values, etc. that are compressible may not be present in the data. For example, in some embodiments, leading zeroes or ones may be removed for the compression—and the data may not have leading zeros or ones. In this case, compression may not work—and thus the data may remain in an initial state that existed before the attempt at compressing the data (i.e., may have the same number of bits or bytes with the same values). In these embodiments, data may be stored in some or all of the cache memories in an uncompressed state. For example, and continuing the example above, when the lighter-weight compression does not result in a reduction/compression of a given piece of data, that piece of data may be stored in L2 cache 118 in the uncompressed state.

In some embodiments, a compression-decompression functional block may attempt two or more compressions for data in a sequence until the data is compressed or the last compression in the sequence has been attempted. Continuing the example above, compression-decompression functional block 128 may first attempt to compress a given piece of data for storage in L3 cache 122 using the lighter-weight compression. When the attempt to compress the given piece of data using the lighter-weight compression is successful, the compressed data may be stored in L3 cache 122 with only the lighter-weight compression applied. In this case, when and if the compressed given piece of data is provided from L3 cache 122 to an L2 cache (e.g., L2 cache 118), the given piece of data can be provided with no decompression because the lighter-weight compression is used for data in the L2 cache. When the lighter-weight compression is unsuccessful (and thus the data remains uncompressed), however, compression-decompression functional block 128 may attempt to compress the given piece of data using the heavier-weight compression. The given piece of data, either compressed using the heavier-weight compression or uncompressed (if the heavier-weight compression was unsuccessful) is then stored in L3 cache 122. When the given piece of data is compressed using the heavier-weight compression, compression-decompression functional block 128 will decompress the given piece of data to reverse the effects of the heavier-weight compression before providing the given piece of data to an L2 cache.

In some embodiments, and differently than the example in the preceding paragraph, a compression-decompression functional block may apply two or more compressions to data in a sequence. Generally, in these embodiments, a given piece of data is compressed using a lighter-weight compression and then the given piece of data (which includes the effects of the lighter-weight compression) is again compressed using a heavier-weight compression. The combined compression is performed for data that is to be stored in cache memories in which both the heavier-weight compression and the lighter-weight compression are allowed to be used. For example, in some of these embodiments, the combined compression is allowed to be used in L3 cache 122. In these embodiments, compression-decompression functional blocks that perform the combined compression may be configured to handle variable-length data for each compression. In other words, because the lighter-weight compression may or may not result in compression of a given piece of data, the heavier-weight compression should be able to handle both uncompressed data and data that has been compressed using the lighter-weight compression.

Compressing Data for Storage in Cache Memories in a Hierarchy of Cache Memories

Figure 2:
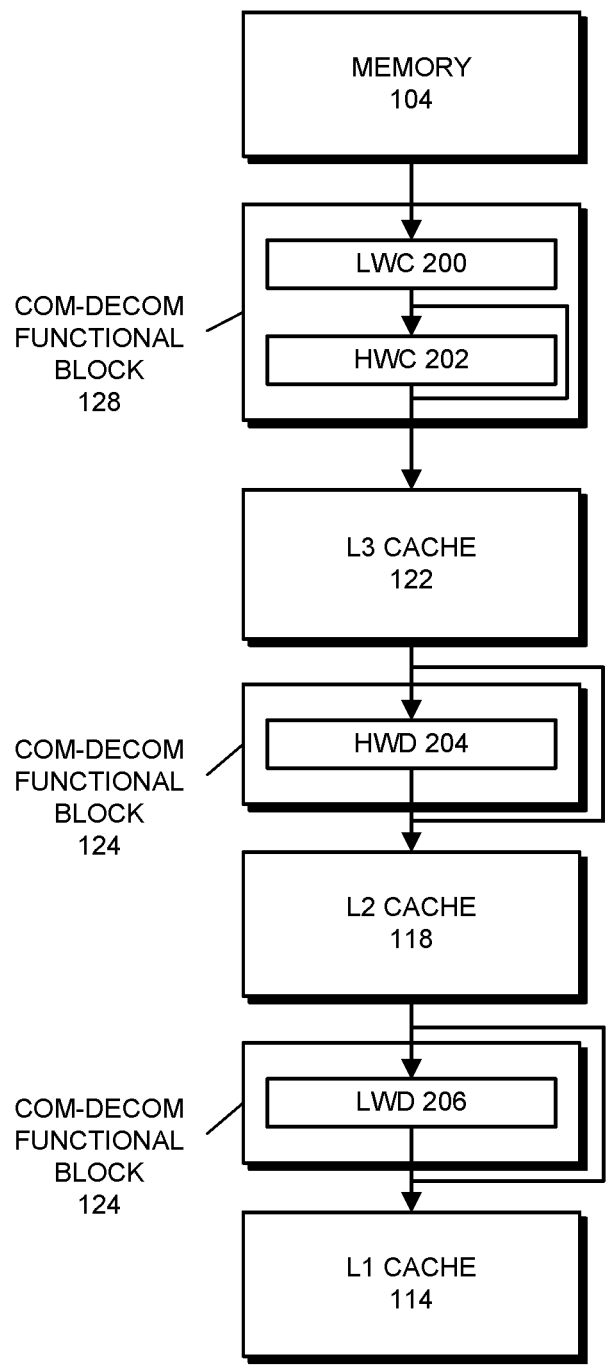
FIG. 2 presents a block diagram illustrating performing compression and decompression on data as data is copied up through cache memories in the hierarchy of cache memories in accordance with some embodiments.
Figure 3:
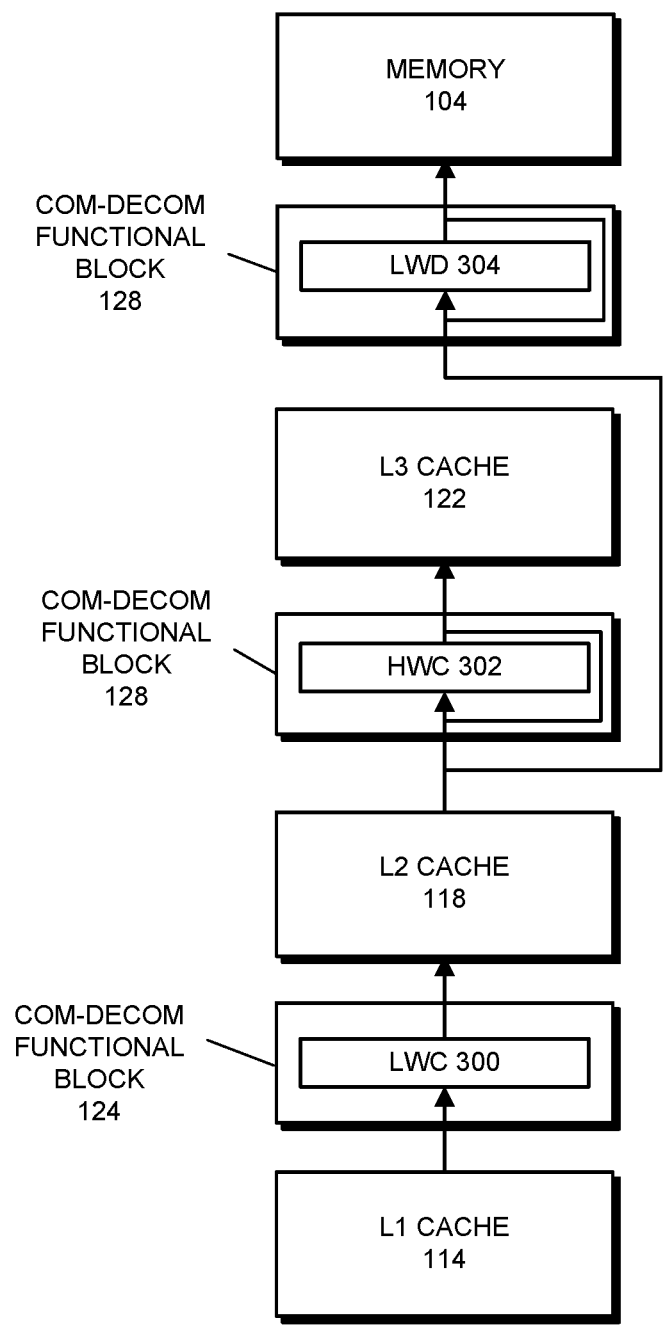
FIG. 3 presents a block diagram illustrating performing compression and decompression on data as data is copied down through cache memories in the hierarchy of cache memories in accordance with some embodiments.

In the described embodiments, data is compressed for storage in cache memories in a hierarchy of cache memories (e.g., L1 caches 114-116, L2 caches 118-120, and L3 cache 122). As data is copied from a memory (e.g., memory 104) up through cache memories in the hierarchy of cache memories, compression-decompression functional blocks (e.g., compression-decompression functional blocks 124-128) perform operations for compressing and decompressing the data so that the data is stored in the cache memories using specified compressions. In addition, as data is provided by a core (e.g., core 106) down through cache memories in the hierarchy of cache memories, the compression-decompression functional blocks perform operations for compressing and decompressing the data so that the data is stored in the cache memories using specified compressions. FIG. 2 presents a block diagram illustrating compression and decompression performed on data as data is copied up through cache memories in the hierarchy of cache memories in accordance with some embodiments. FIG. 3 presents a block diagram illustrating compression and decompression performed on data as data is copied down through cache memories in the hierarchy of cache memories in accordance with some embodiments. Note that the operations shown in FIGS. 2-3 are presented as a general example of operations performed by some embodiments. The operations performed by other embodiments include different operations, operations that are performed in a different order, and/or operations that are performed by different entities or functional blocks.

For the examples in FIGS. 2-3, it is assumed that only one compression at a time is applied to data. As described elsewhere herein, in some embodiments, in specified cache memories (e.g., L3 cache 122), a sequence of two compressions may be applied to data, so that the data is compressed once using a first compression (e.g., a lighter-weight compression) and then the already-compressed data is again compressed using a second compression (e.g., a heavier-weight compression). Although an example is not provided of the combination of compressions, the operations are similar—with the exception of the fact that both compressions can be applied to data at in the sequence and corresponding decompression operations are used to decompress the data.

For the examples in FIGS. 2-3, various compressions and decompressions are described as being applied to data at specified times/in respective cache memories as data is propagated to/from a memory. In some embodiments, some or all of the compressions and/or decompressions are not applied to data and/or the compressions and/or decompressions are applied to data in a different way. For example, in some embodiments, for specified type of data accesses (e.g., higher priority data accesses, etc.) the uncompressed data is provided directly to a requesting entity (e.g., a core, etc.), without being stored in a cache memory. As another example, in some embodiments, uncompressed data acquired from memory is bypassed to a requesting entity (so that the requesting entity is provided the data as soon as possible), but copies are also provided to some or all of the cache memories (possibly in parallel) and compressed before being stored therein.

For the example in FIG. 3, it is assumed that copies of data provided by data sources such as core 106 to be stored in memory are stored in cache memories down through the hierarchy of cache memories (i.e., as with write-through cache memories). In this example, therefore, as a copy of data proceeds down through the hierarchy toward the memory, a copy is stored in each of the cache memories. In some embodiments, copies of data are not propagated down through the hierarchy in this way, but instead are written first to a highest cache in the hierarchy (e.g., L1 caches 114-116) and are subsequently propagated downward via evictions from cache memories (i.e., as with write-back cache memories). The compression-decompression operations described for FIG. 3, however, are similar in these embodiments—and are performed when, and if, a copy of data is stored in each cache memory.

The operations in FIG. 2 start when a copy of data in an uncompressed state (e.g., a 64 B cache line from a specified address in memory) is acquired from memory 104 to be stored in L3 cache 122. Before the data is stored in L3 cache 122, compression-decompression functional block 128 first attempts to compress the data using lighter-weight compression 200. For this operation, compression-decompression functional block 128 applies compression operations, such as pattern matching, value replacement, etc. in accordance with the particular lighter-weight compression in use. If the lighter-weight compression is successful, compression-decompression functional block 128 updates metadata associated with the data to mark the data as having been compressed using the lighter-weight compression and provides the compressed data to L3 cache 122 for storage therein (which is shown by the line bypassing heavier-weight compression 202).

When the attempt to compress the data using the lighter-weight compression is unsuccessful, and thus the data remains uncompressed (i.e., the data lacks the patterns, values, etc. to which the lighter-weight compression applies), compression-decompression functional block 128 attempts to compress the data using heavier-weight compression 202. For this operation, compression-decompression functional block 128 applies compression operations, such as pattern matching, value replacement, etc. in accordance with the particular heavier-weight compression in use. If the heavier-weight compression is successful, compression-decompression functional block 128 updates metadata associated with the data to mark the data as having been compressed using the heavier-weight compression and provides the compressed data to L3 cache 122 for storage therein. Otherwise, if the attempt to compress the data using the heavier-weight compression is unsuccessful, and thus the data remains uncompressed (i.e., the data lacks the patterns, values, etc. to which the heavier-weight compression applies), compression-decompression functional block 128 updates metadata associated with the data to mark the data as being uncompressed and provides the uncompressed data to L3 cache 122 for storage therein.

Upon receiving a request to provide a copy of the data to L2 cache 118, when the data is marked as having been compressed using the heavier-weight compression, L3 cache 122 provides the data to compression-decompression functional block 128. Compression-decompression functional block 128 applies heavier-weight decompression 204 to reverse the heavier-weight compression on the data, thereby restoring the data to the uncompressed state. Compression-decompression functional block 128 then updates metadata associated with the data to mark the data as being uncompressed and provides the data in the uncompressed state to L3 cache 122 for forwarding to L2 cache 118. Otherwise, when the data is marked as being compressed using the lighter-weight compression or is uncompressed, L3 cache 122 immediately provides the data to L2 cache 118—without involving compression-decompression functional block 128 (which is shown by the line bypassing heavier-weight decompression 204). Upon receiving the data in the uncompressed state or compressed using the lighter-weight compression, L2 cache 118 stores the data.

Upon receiving a request to provide a copy of the data to L1 cache 114, when the data is marked as having been compressed using the lighter-weight compression, L2 cache 118 provides the data to compression-decompression functional block 124. Compression-decompression functional block 124 applies lighter-weight decompression 206 to reverse the lighter-weight compression on the data, thereby restoring the data to the uncompressed state. Compression-decompression functional block 124 then updates metadata associated with the data to mark the data as being uncompressed and provides the data in the uncompressed state to L2 cache 118 to be forwarded to L1 cache 114. Otherwise, when the data is marked as being uncompressed, L2 cache 118 immediately provides the data to L1 cache 114—without involving compression-decompression functional block 124 (which is shown by the line bypassing lighter-weight decompression 206). Upon receiving the data in the uncompressed state, L1 cache 114 stores the data. L1 cache 114 may then provide the data to an accessing entity such as core 106—which may have generated the request to store the copy of the data in L1 cache 114.

The operations in FIG. 3 start when a copy of data in an uncompressed state, which is destined to be stored in memory 104, is provided to L1 cache 114 from a data source such as core 106. L1 cache 114 stores a copy of the data (e.g., in a 64 B cache line that includes the data) in L1 cache 114 in an uncompressed state, with metadata associated with the data set to indicate that the data is in the uncompressed state. L1 cache 114 also forwards a copy of the data in the uncompressed state to L2 cache 118 for storage therein.

Upon receiving the copy of the data, L2 cache 114 provides the data to compression-decompression functional block 124. Compression-decompression functional block 124 attempts to compress the data using lighter-weight compression 300. For this operation, compression-decompression functional block 124 applies compression operations, such as pattern matching, value replacement, etc. in accordance with the particular lighter-weight compression in use. If the lighter-weight compression is successful, compression-decompression functional block 124 updates metadata associated with the data to mark the data as having been compressed using the lighter-weight compression and provides the compressed data to L2 cache 118 for storage therein. When the attempt to compress the data using the lighter-weight compression is unsuccessful, and thus the data remains uncompressed (i.e., the data lacks the patterns, values, etc. to which the lighter-weight compression applies), the compression-decompression functional block 124 provides the uncompressed data to L2 cache 118 for storage therein. L2 cache 118 also forwards a copy of the data in the uncompressed state or compressed using the lighter-weight compression to L3 cache 122 for storage therein.

Upon receiving the copy of the data, when the metadata associated with the data indicates that the data is compressed using the lighter-weight compression, L3 cache 122 stores the compressed data (which is shown by the line bypassing heavier-weight compression 302). Otherwise, when the metadata associated with the data indicates that the data is uncompressed, L3 cache 122 provides the data to compression-decompression functional block 128. Compression-decompression functional block 128 attempts to compress the data using heavier-weight compression 302. For this operation, compression-decompression functional block 128 applies compression operations, such as pattern matching, value replacement, etc. in accordance with the particular lighter-weight compression in use. If the heavier-weight compression is successful, compression-decompression functional block 128 updates metadata associated with the data to mark the data as having been compressed using the heavier-weight compression and provides the compressed data to L3 cache 122 for storage therein. When the attempt to compress the data using the heavier-weight compression is unsuccessful, and thus the data remains uncompressed (i.e., the data lacks the patterns, values, etc. to which the lighter-weight compression applies), compression-decompression functional block 128 provides the uncompressed data to L3 cache 122 for storage therein.

L3 cache 122 also provides a copy of the data to memory 104. In some embodiments, data is stored in memory 104 in an uncompressed state. In these embodiments, when data using the lighter-weight compression is received from L2 cache 118, L3 cache 122 provides the data to compression-decompression functional block 128. Compression-decompression functional block 128 applies lighter-weight decompression operations 304 to reverse the lighter-weight compression on the data, thereby restoring the data to the uncompressed state. L3 cache 122 then provides the data in the uncompressed state to the memory. Otherwise, when L3 cache 122 receives uncompressed data, L3 cache 122 immediately provides the data to memory—without using compression-decompression functional block 128 to decompress the data (which is shown by the line bypassing lighter-weight decompression 304). Upon receiving the data in the uncompressed state, the memory stores the data. In some embodiments, data is stored in memory in a compressed state. In these embodiments, and depending on the particular compression used in the memory, L3 cache 122 may provide the data in the compressed state to memory 104 for storage therein, or L3 cache 122 may provide the data in the uncompressed state as described and a compression-decompression mechanism in memory may compress the data using a corresponding compression before the data is stored in memory 104.

Process for Compressing Data for Storage in Cache Memories

Figure 4:
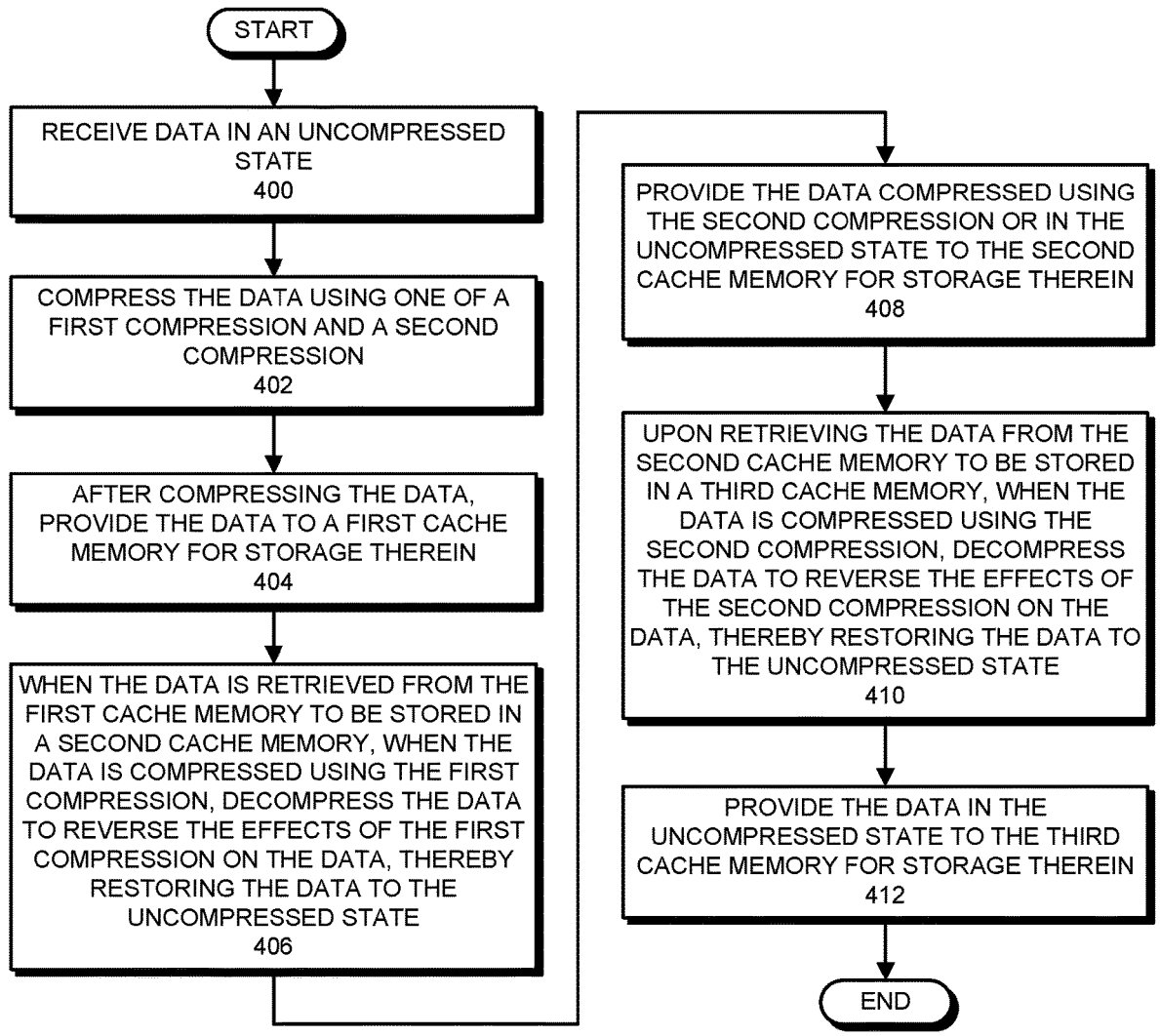
FIG. 4 presents a flowchart illustrating a process for compressing data for storage in cache memories in accordance with some embodiments.

In the described embodiments, an electronic device performs operations for compressing data using specified compressions for storage in cache memories in a hierarchy of cache memories in the electronic device. FIG. 4 presents a flowchart illustrating a process for compressing data for storage in cache memories in accordance with some embodiments. Note that the operations shown in FIG. 4 are presented as a general example of operations performed by some embodiments. The operations performed by other embodiments include different operations, operations that are performed in a different order, and/or operations that are performed by different entities or functional blocks.

For the example in FIG. 4, it is assumed that a first cache memory (e.g., L3 cache 122) is allowed to store (along with uncompressed data) data that is compressed using either of a first compression (e.g., a heavier-weight compression) and a second compression (e.g., a lighter-weight compression), and thus a corresponding compression-decompression functional block (e.g., compression-decompression functional block 128) is able to compress and decompress data using the first compression and the second compression. It is further assumed that a second cache memory (e.g., L2 cache 118) is allowed to store (along with uncompressed data) only data that is compressed using the second compression and thus a corresponding compression-decompression functional block (e.g., compression-decompression functional block 124) is able to compress and decompress data using only the second compression. For this example, the second cache memory is not permitted to store data that has been compressed using the first compression. It is further assumed that a third cache memory (e.g., L1 cache 114) stores only uncompressed data.

Figure 5:
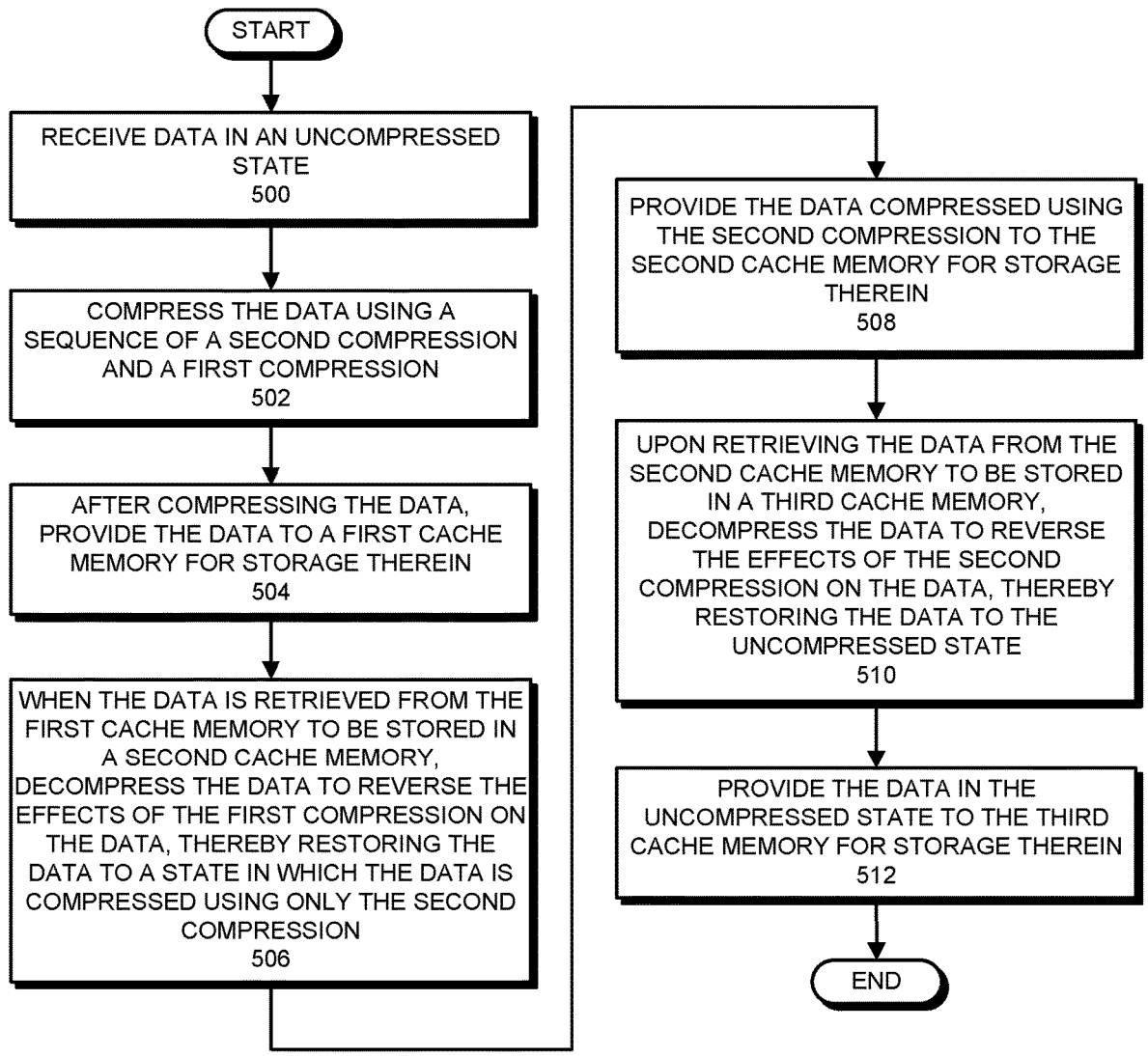
FIG. 5 presents a flowchart illustrating a process for compressing data for storage in cache memories in accordance with some embodiments.

In addition, for the example in FIG. 4, only one of a first compression and a second compression is applied to the data for storage in a first cache memory. This is not, however, a requirement. FIG. 5 presents a flowchart illustrating an embodiment in which a sequence of compressions is applied to the data for storage in the first cache memory.

The operations in FIG. 4 start when a compression-decompression functional block receives data in an uncompressed state (step 400). For this operation, the compression-decompression functional block receives data such as a 64 B cache line from a memory (e.g., memory 104) or another source (e.g., a network interface, a processor, etc.) in the uncompressed state. In the "uncompressed" state, the full set of the bits/bytes of the data in accordance with a type of the data are present and configured to represent a value of the data—and the data has not yet been compressed. For example, if the data includes one or more 32-bit floating point values, all 32 bits representing each of the one or more values (e.g., sign, exponent, and fraction) are present.

The compression-decompression functional block then compresses the data using one of a first compression and a second compression (step 402). Each of the first compression and second compression includes one or more compression operations during which some or all of the bits/bytes of the uncompressed data are removed, reduced, replaced, or otherwise altered. The particular one or more compression operations for each of the first compression and the second compression—and thus the changes made to the uncompressed data during the respective compression—depend on the type of the compression. For example, the first compression and/or the second compression can be or include one or more of pattern matching compression, value matching compression, zero content compression, Lempel-Ziv (LZ) (and variants) compression, Markov compression, delta compression, etc.

For the operation in step 402, when compressing the data using the one of the first compression and the second compression, the compression-decompression functional block first attempts to compress the data using the second compression (e.g., the lighter-weight compression). The second compression is attempted before the first compression (e.g., the heavier-weight compression) because both the first cache memory and the second cache memory are allowed to store—and can decompress—data that is compressed using the second compression. When the data is copied from the first cache memory to the second cache memory, therefore, the data can be copied without decompressing the data—which avoids the need for the compression-decompression functional block to perform corresponding decompression operations. When the data is compressed using the second compression, the compression-decompression functional block sets metadata (e.g., one or more bits) associated with the data to indicate that the data was compressed using the second compression and provides the compressed data to the first cache memory for storage therein (step 404).

Although the second compression is attempted, it is possible, due to the data lacking corresponding patterns, values, etc. that the second compression does not result in compression of the data, and thus the data remains in the uncompressed state. In this case, the compression-decompression functional block attempts to compress the data using the first compression. The compression-decompression functional block attempts the first compression because, despite the need for decompressing the data when copying data that was compressed using the first compression from the first cache memory to the second cache memory, it is desirable to have the data compressed for storage in the first cache memory to better use the available storage in the first cache memory. When the data is compressed using the first compression, the compression-decompression functional block sets the metadata associated with the data to indicate that the data was compressed using the first compression and provides the compressed data to the first cache memory for storage therein (step 404).

For the example in FIG. 4, it is assumed that the data is successfully compressed using one of the first compression and the second compression. If the data was unable to be compressed despite attempts to compress the data using the first compression and the second compression, the data would be stored in the first cache memory in the uncompressed state. In this case, the uncompressed data is simply copied from the first cache memory to the second cache memory in step 408.

When data is retrieved from the first cache memory to be stored in the second cache memory, when the data is compressed using the first compression, the compression-decompression functional block decompresses the data to reverse the effects of the first compression on the data, thereby restoring the data to the uncompressed state (step 406). For this operation, the compression-decompression functional block performs one or more decompression operations during which some or all of the bits/bytes of the data that were previously removed, reduced, replaced, or otherwise altered are restored to the original, full values. As with the compression, the particular one or more decompression operations that are performed depend on the type of the first compression. During this operation, the compression-decompression functional block places the data in a condition (uncompressed) in which the data can be stored in the second cache memory. The data, either compressed using the second compression (compressed in step 402) or in the uncompressed state, is then provided to the second cache memory for storage therein (step 408).

When data is retrieved from the second cache memory to be stored in the third cache memory, when the data is compressed using the second compression, the compression-decompression functional block decompresses the data to reverse the effects of the second compression on the data, thereby restoring the data to the uncompressed state (step 410). For this operation, the compression-decompression functional block performs one or more decompression operations during which some or all of the bits/bytes of the data that were previously removed, reduced, replaced, or otherwise altered are restored to the original, full values. As with the compression, the particular one or more decompression operations that are performed depend on the type of the second compression. During this operation, the compression-decompression functional block places the data in a condition (uncompressed) in which the data can be stored in the third cache memory. The data in the uncompressed state is then provided to the second cache memory for storage therein (step 412).

Turning now to FIG. 5, FIG. 5 presents a flowchart illustrating a process for compressing data for storage in cache memories in accordance with some embodiments. Note that the operations shown in FIG. 5 are presented as a general example of operations performed by some embodiments. The operations performed by other embodiments include different operations, operations that are performed in a different order, and/or operations that are performed by different entities or functional blocks.

For the example in FIG. 5, it is assumed that a first cache memory (e.g., L3 cache 122) is allowed to store (along with uncompressed data) data that is compressed using a sequence of a second compression (e.g., a lighter-weight compression) and a first compression (e.g., a heavier-weight compression) and thus a corresponding compression-decompression functional block (e.g., compression-decompression functional block 128) is able to compress and decompress data using the first compression and the second compression. It is further assumed that a second cache memory (e.g., L2 cache 118) is allowed to store (along with uncompressed data) only data that is compressed using the second compression and thus a corresponding compression-decompression functional block (e.g., compression-decompression functional block 124) is able to compress and decompress data using only the second compression. For this example, the second cache memory is not permitted to store data that has been compressed using the first compression. It is further assumed that a third cache memory (e.g., L1 cache 114) stores only uncompressed data.

In addition, and differently than the example in FIG. 4, for the example in FIG. 5, a sequence of both the second compression and the first compression are applied to the data for storage in a first cache memory. In other words, the data is compressed using the second compression and the already-compressed data is again compressed using the first compression. This combination of compressions may result in more reduction of data size than either compression alone. In some embodiments, the latter compression, i.e., the first compression, includes one or more operations for handling different-length data—as the data may be successfully compressed using the second compression or may be uncompressed (in the event that the data lacks the patterns, values, etc. compressible by the second compression).

Also, for the example in FIG. 5, it is assumed that the data is successfully compressed using the sequence of the second compression and the first compression. If the data was unable to be compressed despite attempts to compress the data using the first compression and/or the second compression, the data would be stored in the first cache memory in the uncompressed state or in some other one-compression state. In this case, the operations of FIG. 5 are altered to operate using one-compression compressed data (similarly to FIG. 4).

The operations in FIG. 5 start when a compression-decompression functional block receives data in an uncompressed state (step 500). For this operation, the compression-decompression functional block receives data such as a 64 B cache line from a memory (e.g., memory 104) or another source (e.g., a network interface, a processor, etc.) in the uncompressed state. In the "uncompressed" state, the full set of the bits/bytes of the data in accordance with a type of the data are present and configured to represent a value of the data—and the data has not yet been compressed. For example, if the data includes one or more 32-bit floating point values, all 32 bits representing each of the values (e.g., sign, exponent, and fraction) are present.

The compression-decompression functional block then compresses the data using a sequence of the second compression and then the first compression (step 502). Each of the first compression and second compression includes one or more compression operations during which some or all of the bits/bytes of the data are removed, reduced, replaced, or otherwise altered. The particular one or more compression operations for each of the first compression and the second compression—and thus the changes made to the data during the respective compression—depend on the type of the compression. For example, the first compression and/or the second compression can be or include one or more of pattern matching compression, value matching compression, zero content compression, Lempel-Ziv (LZ) (and variants) compression, Markov compression, delta compression, etc.

For the operation in step 502, both the second compression and the first compression are performed for the data. The second compression is performed first, and thus the data is initially compressed using the second compression, because both the second cache memory is allowed to store—and can decompress—data that is compressed using the second compression. The first compression is then performed in an attempt to further reduce data size. This order of compressions enables the data to be decompressed to reverse the effects of the first compression, and to restore the data to only having the effects of the second compression, in preparation for storing a copy in the second cache memory. After compressing the data using the sequence of the second compression and the first compression, the compression-decompression functional block sets metadata (e.g., one or more bits) associated with the data to indicate that the data was compressed using the sequence of the second compression and the first compression, and provides the compressed data to the first cache memory for storage therein (step 504).

When data is retrieved from the first cache memory to be stored in the second cache memory, the compression-decompression functional block decompresses the data to reverse the effects of the first compression on the data, thereby restoring the data to a state in which the data is compressed using only the second compression (step 506). For this operation, the compression-decompression functional block performs one or more decompression operations during which some or all of the bits/bytes of the data that were previously removed, reduced, replaced, or otherwise altered are restored to the values subsequent to the second compression. As with the compression, the particular one or more decompression operations that are performed depend on the type of the first compression. During this operation, the compression-decompression functional block places the data in a condition (compressed using only the second compression) in which the data can be stored in the second cache memory and updates the metadata associated with the data to indicate that the data is compressed using only the second compression. The data, compressed using the second compression (compressed in step 502), is then provided to the second cache memory for storage therein (step 508).

When data is retrieved from the second cache memory to be stored in the third cache memory, the compression-decompression functional block decompresses the data to reverse the effects of the second compression on the data, thereby restoring the data to the uncompressed state (step 510). For this operation, the compression-decompression functional block performs one or more decompression operations during which some or all of the bits/bytes of the data that were previously removed, reduced, replaced, or otherwise altered are restored to the original, full values. As with the compression, the particular one or more decompression operations that are performed depend on the type of the second compression. During this operation, the compression-decompression functional block places the data in a condition (uncompressed) in which the data can be stored in the third cache memory. The data in the uncompressed state is then provided to the second cache memory for storage therein (step 512).

In some embodiments, an electronic device (e.g., electronic device 100 and/or some portion thereof) uses code and/or data stored on a non-transitory computer-readable storage medium to perform some or all of the operations herein described. More specifically, the electronic device reads the code and/or data from the computer-readable storage medium and executes the code and/or uses the data when performing the described operations. A computer-readable storage medium can be any device, medium, or combination thereof that stores code and/or data for use by an electronic device. For example, the computer-readable storage medium can include, but is not limited to, volatile and/or non-volatile memory, including flash memory, random access memory (e.g., eDRAM, RAM, SRAM, DRAM, DDR4 SDRAM, etc.), read-only memory (ROM), and/or magnetic or optical storage mediums (e.g., disk drives, magnetic tape, CDs, DVDs, etc.).

In some embodiments, one or more hardware modules perform the operations herein described. For example, the hardware modules can include, but are not limited to, one or more processors/cores/central processing units (CPUs), application-specific integrated circuit (ASIC) chips, neural network processors or accelerators, field-programmable gate arrays (FPGAs), compute units, embedded processors, graphics processors (GPUs)/graphics cores, pipelines, accelerated processing units (APUs), functional blocks, controllers, compression-decompression functional blocks, and/or other programmable-logic devices. When such hardware modules are activated, the hardware modules perform some or all of the operations. In some embodiments, the hardware modules include one or more general purpose circuits that are configured by executing instructions (program code, firmware, etc.) to perform the operations.

In some embodiments, a data structure representative of some or all of the structures and mechanisms described herein (e.g., electronic device 100, compression-decompression functional blocks 124-128, cache memories in the hierarchy of cache memories, and/or some portion thereof) is stored on a non-transitory computer-readable storage medium that includes a database or other data structure which can be read by an electronic device and used, directly or indirectly, to fabricate hardware including the structures and mechanisms. For example, the data structure may be a behavioral-level description or register-transfer level (RTL) description of the hardware functionality in a high level design language (HDL) such as Verilog or VHDL. The description may be read by a synthesis tool which may synthesize the description to produce a netlist including a list of gates/circuit elements from a synthesis library that represent the functionality of the hardware including the above-described structures and mechanisms. The netlist may then be placed and routed to produce a data set describing geometric shapes to be applied to masks. The masks may then be used in various semiconductor fabrication steps to produce a semiconductor circuit or circuits (e.g., integrated circuits) corresponding to the above-described structures and mechanisms. Alternatively, the database on the computer accessible storage medium may be the netlist (with or without the synthesis library) or the data set, as desired, or Graphic Data System (GDS) II data.

In this description, variables or unspecified values (i.e., general descriptions of values without particular instances of the values) are represented by letters such as N. As used herein, despite possibly using similar letters in different locations in this description, the variables and unspecified values in each case are not necessarily the same, i.e., there may be different variable amounts and values intended for some or all of the general variables and unspecified values. In other words, N and any other letters used to represent variables and unspecified values in this description are not necessarily related to one another.

The expression "et cetera" or "etc." as used herein is intended to present an and/or case, i.e., the equivalent of "at least one of" the elements in a list with which the etc. is associated. For example, in the statement "the electronic device performs a first operation, a second operation, etc.," the electronic device performs at least one of the first operation, the second operation, and other operations. In addition, the elements in a list associated with an etc. are merely examples from among a set of examples—and at least some of the examples may not appear in some embodiments.

The foregoing descriptions of embodiments have been presented only for purposes of illustration and description. They are not intended to be exhaustive or to limit the embodiments to the forms disclosed. Accordingly, many modifications and variations will be apparent to practitioners skilled in the art. Additionally, the above disclosure is not intended to limit the embodiments. The scope of the embodiments is defined by the appended claims.

What is claimed is:

1. An electronic device that compresses data for storage in cache memories, the electronic device comprising:
   a hierarchy of cache memories including a first cache memory and a second cache memory, the first cache memory being lower in the hierarchy than the second cache memory; and
   at least one compression-decompression functional block configured to:
      receive data in an uncompressed state;
      compress the data using one of a first compression or a second compression by using the second compression and then using the first compression when using the second compression does not result in compression of the data;
      after compressing the data, provide the data to the first cache memory for storage therein;
      when the data is retrieved from the first cache memory to be stored in the second cache memory, when the data is compressed using the first compression, decompress the data to reverse effects of the first compression on the data, thereby restoring the data to the uncompressed state; and
      provide the data compressed using the second compression or in the uncompressed state to the second cache memory for storage therein.

2. The electronic device of claim 1, further comprising:
   a third cache memory in the hierarchy of cache memories, the second cache memory being lower in the hierarchy than the third cache memory, wherein:
      when the data is retrieved from the second cache memory to be stored in the third cache memory, when the data is compressed using the second compression, the at least one compression-decompression functional block:
         decompresses the data to reverse effects of the second compression on the data, thereby restoring the data to the uncompressed state; and
         provides the data to the third cache memory for storage therein.

3. The electronic device of claim 2, wherein:
   the first compression is a heavier-weight compression and the second compression is a lighter-weight compression; and
   decompressing the data using the lighter-weight compression is faster than decompressing the data using the heavier-weight compression.

4. The electronic device of claim 1, wherein compressing the data using the one of the first compression or the second compression comprises:
   performing one or more second compression operations of the second compression on the data, the one or more second compression operations compressing data having second properties; and
   when the one or more compression operations of the second compression do not result in compression of the data due to the data not having the second properties, performing one or more first compression operations of the first compression on the data, the one or more first compression operations compressing data having first properties.

5. The electronic device of claim 4, wherein one or both of the first compression operations and the second compression operations include at least one of pattern matching compression, value matching compression, zero content compression, Lempel-Ziv-based compression, Markov compression, and delta compression.

6. The electronic device of claim 4, wherein, when both the first properties and the second properties are not present in the data, so that neither the first compression nor the second compression results in compression of the data, storing the data in the first cache memory and the second cache memory in the uncompressed state.

7. The electronic device of claim 1, wherein, after compressing data using the one of the first compression or the second compression, the at least one compression-decompression functional block is configured to:
   update metadata associated with the data to indicate that the data was compressed using a respective one of the first compression or the second compression.

8. The electronic device of claim 1, wherein the at least one compression-decompression functional block is further configured to:
   receive other data in the uncompressed state;

compress the other data using a sequence of the second compression and the first compression, the first compression supporting variable input formats;

after compressing the other data, provide the other data to the first cache memory for storage therein;

when the other data is retrieved from the first cache memory to be stored in the second cache memory, decompress the other data to reverse effects of the first compression on the other data, thereby restoring the other data to a state in which the other data is compressed using only the second compression; and provide the other data compressed using the second compression to the second cache memory for storage therein.

9. The electronic device of claim 1, wherein the at least one compression-decompression functional block receives the data from a memory.

10. The electronic device of claim 9, wherein the data stored in the memory is compressed using a third compression and is decompressed to restore the data to the uncompressed state before the data is forwarded to the compression-decompression functional block.

11. The electronic device of claim 9, wherein the data is compressed using a third compression for communication via one or more communication links between the memory and the at least one compression-decompression functional block.

12. A method for compressing data for storage in cache memories in an electronic device that comprises a hierarchy of cache memories including a first cache memory and a second cache memory, the first cache memory being lower in the hierarchy than the second cache memory, and at least one compression-decompression functional block, the method comprising:

receiving, by the at least one compression-decompression functional block, data in an uncompressed state;

compressing, by the at least one compression-decompression functional block, the data using one of a first compression or a second compression by using the second compression and then using the first compression when using the second compression does not result in compression of the data;

after compressing the data, providing, by the at least one compression-decompression functional block, the data to the first cache memory for storage therein;

when the data is retrieved from the first cache memory to be stored in the second cache memory, when the data is compressed using the first compression, decompressing, by the at least one compression-decompression functional block, the data to reverse effects of the first compression on the data, thereby restoring the data to the uncompressed state; and providing, by the at least one compression-decompression functional block, the data compressed using the second compression or in the uncompressed state to the second cache memory for storage therein.

13. The method of claim 12, wherein:
the electronic device further comprises a third cache memory in the hierarchy of cache memories, the second cache memory being lower in the hierarchy than the third cache memory; and the method further comprises:
when the data is retrieved from the second cache memory to be stored in the third cache memory, when the data is compressed using the second compression:

decompressing, by the at least one compression-decompression functional block, the data to reverse effects of the second compression on the data, thereby restoring the data to the uncompressed state; and providing, by the at least one compression-decompression functional block, the data to the third cache memory for storage therein.

14. The method of claim 13, wherein:
the first compression is a heavier-weight compression and the second compression is a lighter-weight compression; and decompressing the data using the lighter-weight compression is faster than decompressing the data using the heavier-weight compression.

15. The method of claim 12, wherein compressing the data using the one of the first compression or the second compression comprises:

performing one or more second compression operations of the second compression on the data, the one or more second compression operations compressing data having second properties; and when the one or more compression operations of the second compression do not result in compression of the data due to the data not having the second properties, performing one or more first compression operations of the first compression on the data, the one or more first compression operations compressing data having first properties.

16. The method of claim 15, wherein one or both of the first compression operations and the second compression operations include at least one of pattern matching compression, value matching compression, zero content compression, Lempel-Ziv-based compression, Markov compression, and delta compression.

17. The method of claim 15, wherein, when both the first properties and the second properties are not present in the data, so that neither the first compression nor the second compression results in compression of the data, the method further comprises:

storing the data in the first cache memory and the second cache memory in the uncompressed state.

18. The method of claim 12, wherein the method further comprises, after compressing data using the one of the first compression or the second compression:

updating, by the compression-decompression functional block, metadata associated with the data to indicate that the data was compressed using a respective one of the first compression or the second compression.

19. The method of claim 12, wherein the method further comprises:

receiving, by the at least one compression-decompression functional block, other data in the uncompressed state;

compressing, by the at least one compression-decompression functional block, the other data using a sequence of the second compression and the first compression, the first compression supporting variable input formats;

after compressing the other data, providing, by the at least one compression-decompression functional block, the other data to the first cache memory for storage therein;

when the other data is retrieved from the first cache memory to be stored in the second cache memory, decompress the other data to reverse effects of the first compression on the other data, thereby restoring the other data to a state in which the other data is compressed using only the second compression; and providing, by the at least one compression-decompression functional block, the other data compressed using the second compression to the second cache memory for storage therein.

20. The method of claim 12, further comprising:
receiving, by the at least one compression-decompression functional block, the data from a memory, the data being compressed using a third compression for storage in the memory and decompressed for communication to the at least one compression-decompression functional block.

* * * * *